United States Patent [19]
Parker et al.

[11] Patent Number: 5,554,825
[45] Date of Patent: Sep. 10, 1996

[54] FLEXIBLE CABLE WITH A SHIELD AND A GROUND CONDUCTOR

[75] Inventors: Stephen M. Parker, High Point, N.C.; Thomas J. Lynch, Mechanicsburg, Pa.

[73] Assignee: The Whitaker Corporation, Wilmington, Del.

[21] Appl. No.: 338,920

[22] Filed: Nov. 14, 1994

[51] Int. Cl.[6] .................................................. H01B 7/08
[52] U.S. Cl. ................. 174/117 F; 174/117 FF; 174/117 A
[58] Field of Search ...................... 174/36, 117 F, 174/117 FF, 117 A, 117 R, 113 R

[56] References Cited

U.S. PATENT DOCUMENTS

| | | | |
|---|---|---|---|
| 3,547,718 | 12/1970 | Gordon | 156/55 X |
| 3,763,306 | 10/1973 | Marshall | 174/115 X |
| 3,876,964 | 4/1975 | Balaster et al. | 333/84 M |
| 4,149,026 | 4/1979 | Fritz et al. | 174/32 |
| 4,172,626 | 10/1979 | Olsson | 339/17 F |
| 4,287,385 | 9/1981 | Dombrowsky | 174/36 |
| 4,455,818 | 6/1984 | Sugimoto et al. | 57/293 |
| 4,490,574 | 12/1984 | Tomita et al. | 174/36 |
| 4,538,024 | 8/1985 | Wise et al. | 174/117 F |
| 4,588,852 | 5/1986 | Fetterolf et al. | 174/36 |
| 4,633,098 | 5/1987 | Gilliam et al. | 264/104 |
| 4,644,092 | 2/1987 | Gentry | 174/36 |
| 4,680,423 | 7/1987 | Bennett et al. | 174/36 |
| 4,714,435 | 12/1987 | Stipanuk et al. | 439/496 |
| 4,719,319 | 1/1988 | Tighe, Jr. | 174/103 |
| 4,829,432 | 5/1989 | Hershberger et al. | 361/424 |
| 4,887,187 | 12/1989 | Nikola | 361/369 |
| 4,894,753 | 1/1990 | Wadell et al. | 361/424 |
| 4,926,007 | 5/1990 | Aufderheide et al. | 174/36 |
| 4,952,020 | 8/1990 | Huber | 350/96.23 |
| 4,967,315 | 10/1990 | Schelhorn | 361/424 |
| 4,967,316 | 10/1990 | Goebel et al. | 361/424 |
| 5,003,126 | 3/1991 | Fujii et al. | 174/36 |
| 5,028,742 | 7/1991 | Redman | 174/88 R |
| 5,051,098 | 9/1991 | Auclair et al. | 439/99 |
| 5,051,544 | 9/1991 | Harris | 174/117 F |
| 5,053,583 | 10/1991 | Miller et al. | 174/36 |
| 5,389,741 | 2/1995 | Ueno | 174/117 F |
| 5,414,220 | 5/1995 | Hanato et al. | 174/254 |
| 5,416,268 | 5/1995 | Ellis | 174/36 |

*Primary Examiner*—Laura Thomas
*Assistant Examiner*—Chau N. Nguyen

[57] ABSTRACT

A cable (1) on an end of an electrical cable, is constructed with, a flexible and flat conductive shield (7), a flexible ribbon of insulation (3) separating the shield (7) from multiple flexible signal conductors (2) extending along the insulation (3), and at least one flexible ground conductor (6) between the insulation (3) and the shield (7), the signal conductors (2) are spaced apart on pitch spacings, with a signal conductor (2) being absent from at least one of the pitch spacings, and the ground conductor (6) extending above said one of the pitch spacings.

9 Claims, 7 Drawing Sheets

FLEXIBLE CABLE WITH A SHIELD AND A GROUND CONDUCTOR

FIELD OF THE INVENTION

The invention relates to a flexible flat electrical cable, and, more particularly to a flexible flat electrical cable with a conductive shield.

BACKGROUND OF THE INVENTION

A flexible flat electrical cable comprises, multiple electrical conductors that extend along a continuous ribbon. The cross sections of the conductors can be round or flat, according to U.S. Pat. Nos. 4,287,385, and 4,149,026. According to U.S. Pat. No. 4,455,818, the conductors can be twisted together. According to U.S. Pat. No. 5,051,544, both the signal conductors and the ground conductors extend side by side in the same plane. A short piece of insulation is inserted in the cable. The signal conductors pass under the short piece of insulation. The ground conductors extend over the short piece of insulation. The short piece of insulation elevates the ground conductors from the remainder of the cable to improve access to the ground conductors.

SUMMARY OF THE INVENTION

According to an aspect of the invention, an electrical cable comprises, a flexible and flat conductive shield, a flexible ribbon of insulation separating the shield from multiple flexible signal conductors extending along the insulation, and at least one flexible ground conductor between the insulation and the shield. Each said ground conductor is accessible by being in a separate plane, and is easily terminated, for example with an electrical connector.

According to another aspect; of the invention, a flat cable, having a construction described in the previous paragraph of text, further comprises, each ground conductor overlying and extending above a corresponding space between signal conductors. Such a cable construction allows terminated ground conductors to extend in a plane above the plane of the signal conductors, or to extend into the plane of the signal conductors side by side with the signal conductors.

According to an embodiment of the invention, the signal conductors are spaced apart on pitch spacings, with a signal conductor absent from at least one of the pitch spacings, and the ground conductor extends above said one of the pitch spacings.

According to an embodiment of the invention, at least one opening through the shield exposes the insulation and each said ground conductor. The opening provides a location for severing the ground conductors and bending the ground conductors away from a remainder of the cable. The remainder of the cable is exposed at the opening for access to the signal conductors.

DESCRIPTION OF THE DRAWINGS

An embodiment of the invention will now be described with reference to the accompanying drawings, according to which.

DESCRIPTION

Figure 1:
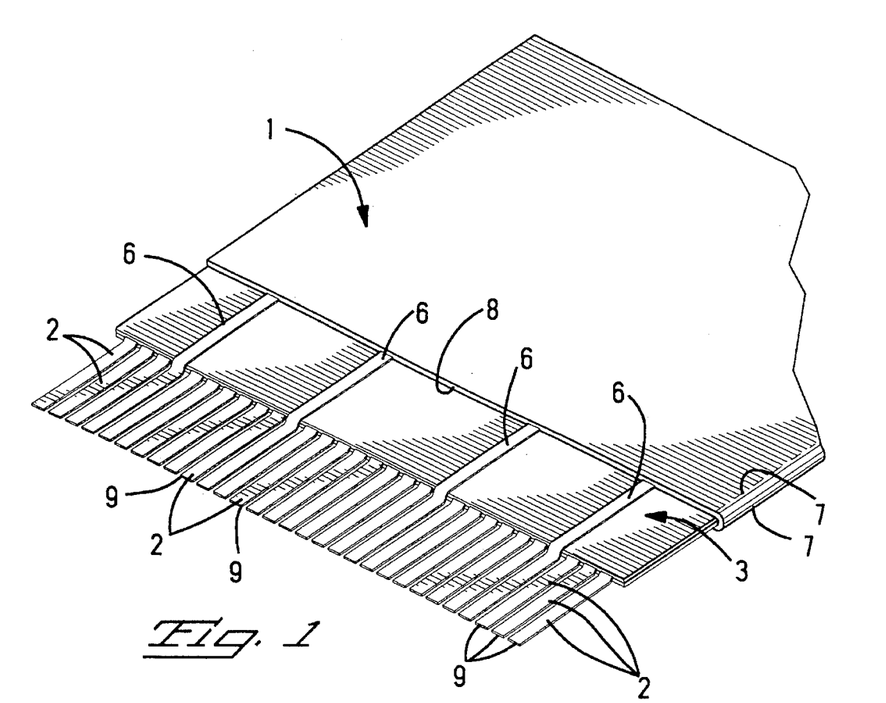
FIG. 1 is a fragmentary perspective view of an electrical cable, cut to length and ready for termination.
Figure 2:
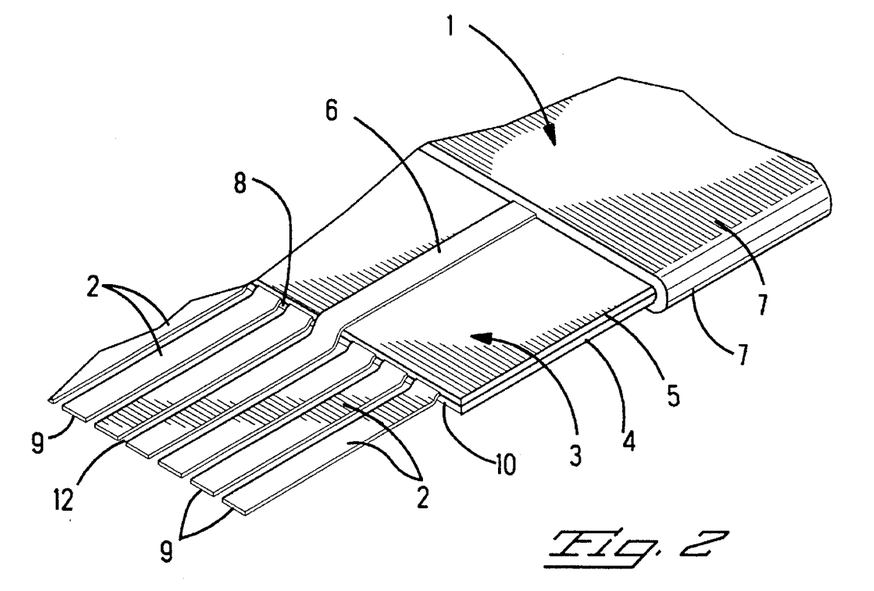
FIG. 2 is a view similar to FIG. 1 and enlarged.
Figure 3:
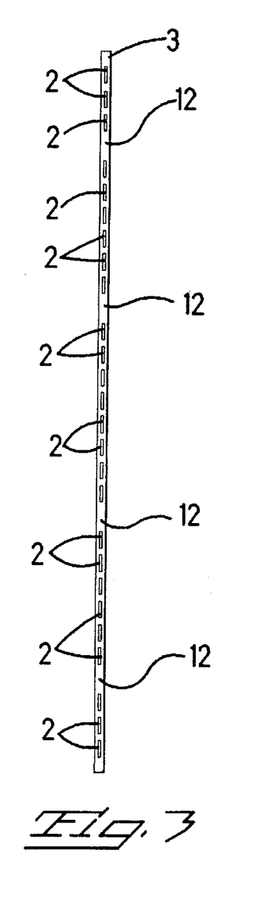
FIG. 3 is an end view of the cable shown in FIG. 4.
Figure 4:
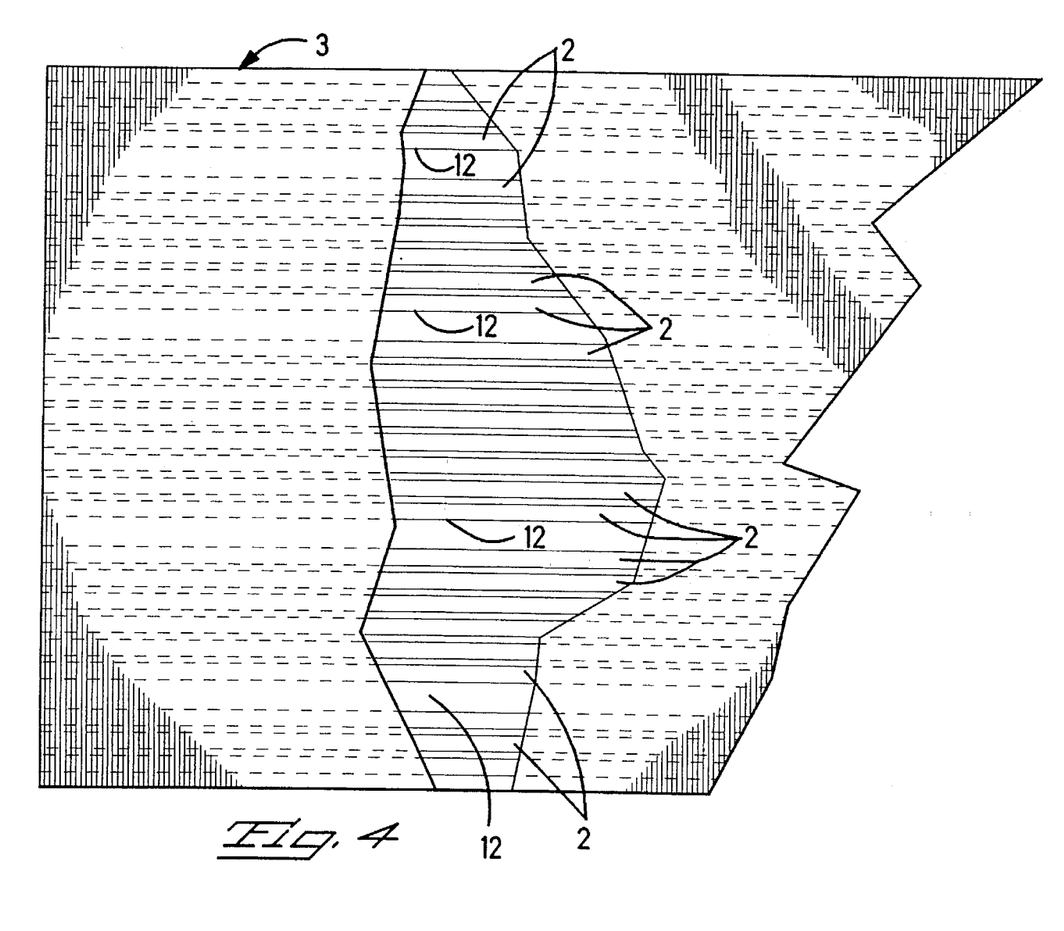
FIG. 4 is a fragmentary top view of the cable during one stage of construction shown in FIG. 1 with parts cut away.
Figures 5, 6:
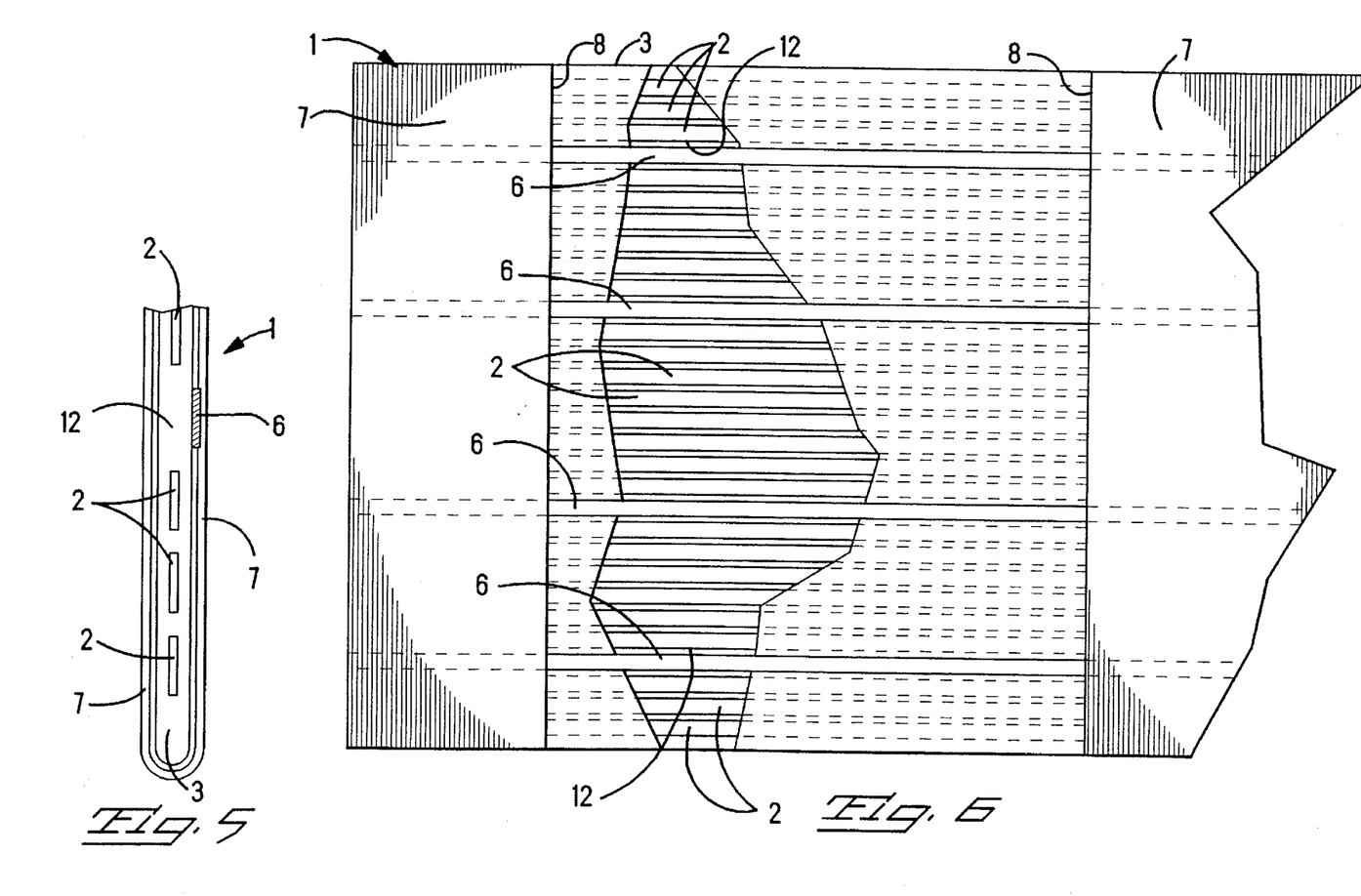
FIG. 5 is a section view of a portion of a cable shown in FIG. 6.
FIG. 6 is a fragmentary top view of the cable shown in FIG. 1 prior to being cut to length, and shown with parts cut away.

With reference to FIGS. 1, 2 and 6, a cable 1 comprises, multiple, flexible and flat signal conductors 2 extending along a flexible ribbon of insulation 3. For example, the signal conductors 2 are illustrated as being flat and rectangular. With reference to FIGS. 2 and 3, the signal conductors 2 are imbedded in the insulation 3 that is of unitary construction, FIG. 3, or is a composite of two thin layers 4, 5, FIG. 2. The two layers 4, 5 are bonded together by fusion melting or by an adhesive, not shown.

With reference to FIGS. 1, 2 and 6, at least one ground conductor 6 is laid over the insulation 3 on one broad side of the insulation 3. FIG. 6 shows additional ground conductors 6 laid over the insulation 3. The signal conductors 2 are coplanar within a first plane. The insulation 3 is in a second plane. Each said ground conductor 6 is in a third plane that is above and separated from the first and second planes. Each said ground conductor 6 is separated from the plane of the signal conductors 2. The signal conductors 2 are spaced apart on pitch spacings, meaning that the longitudinal axes of the signal conductors 2 extend along spaced apart, consecutive centerlines. However, the cable 1 is constructed purposely with a signal conductor 2 being absent from at least one of the pitch spacings, and said at least one ground conductor 6 extends above said one of the pitch spacings. In place of each absent signal conductor 2 along one of the pitch spacings, a ground conductor 6 can be present to extend above said one of the pitch spacings. In FIG. 6, multiple ground conductors 6 extend above corresponding pitch spacings. It can be stated further, that the signal conductors 2 are spaced apart one from another by corresponding spaces 12, and each said ground conductor 6 overlies and extends above a corresponding space 12.

A flexible and flat conductive shield 7 comprises a laminate of a conductive adhesive and a flexible and flat insulating film on each broad side of the insulation 3. The film of the shield 7 is constructed as solely insulation, or is constructed as a laminate of insulation and a thin foil of conductive metal to which the conductive adhesive adheres. The shield 7 wraps around an exterior of the flexible ribbon of insulation 3, and is secured by the conductive adhesive being adhered to the flexible ribbon of insulation 3. Said insulation 3 separates the shield 7 from the signal conductors 2 extending along the insulation 3. The shield 7 is secured to, and electrically connected to, each said ground conductor 6 by the conductive adhesive adhering to each said ground conductor 6.

With reference to FIG. 6, the cable 1 is constructed with at least one opening 8 through the shield 7 exposing the insulation 3 and each said ground conductor 6. Each said ground conductor 6 bridges across said at least one opening 8 without being secured to the insulation 3 exposed at said opening 8. Accordingly, each said ground conductor 6 is accessible at the opening 8 for electrical termination.

Figure 7:
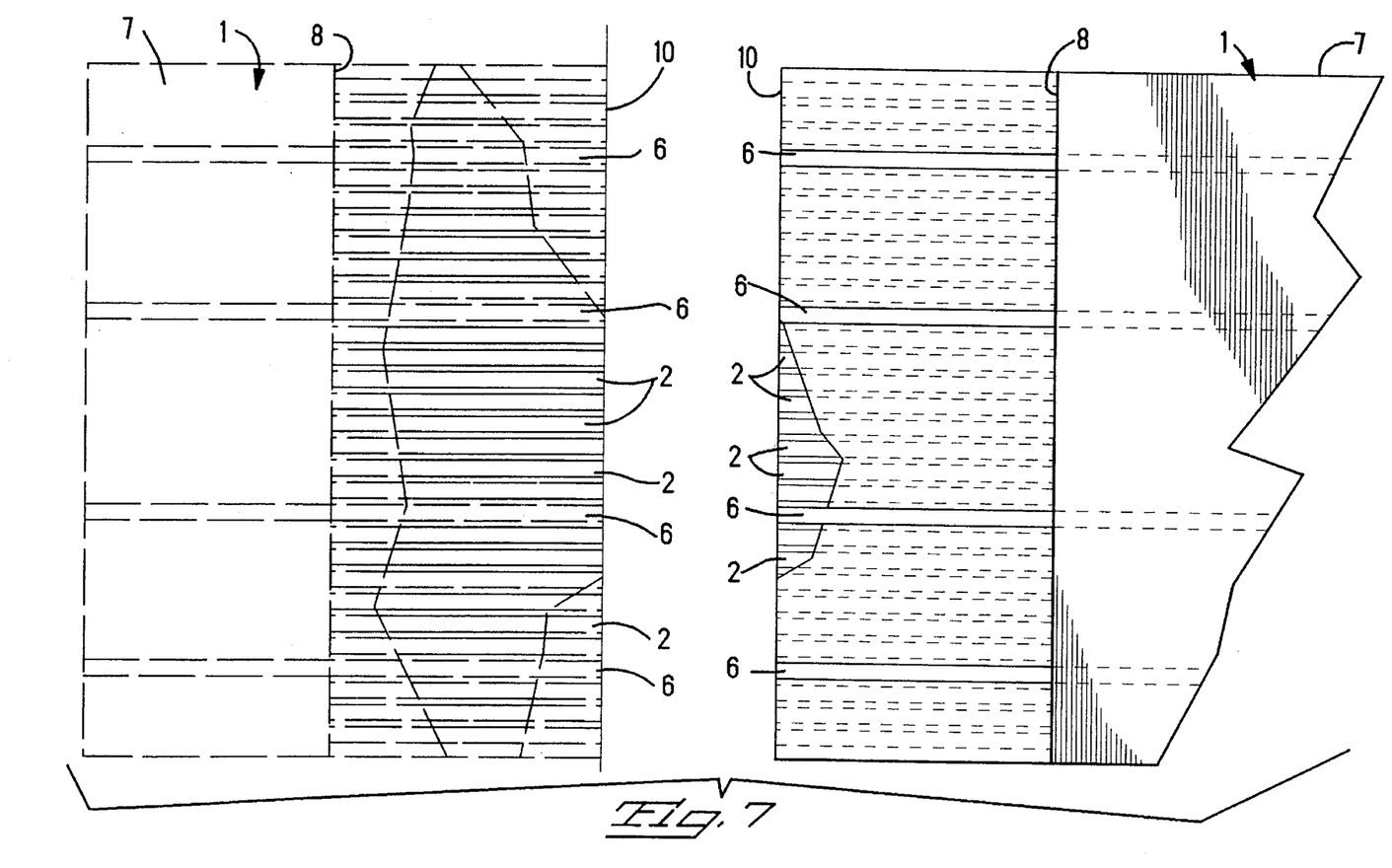
FIG. 7 is a top view of the cable shown in FIG. 6, with the cable being severed.
Figure 9:
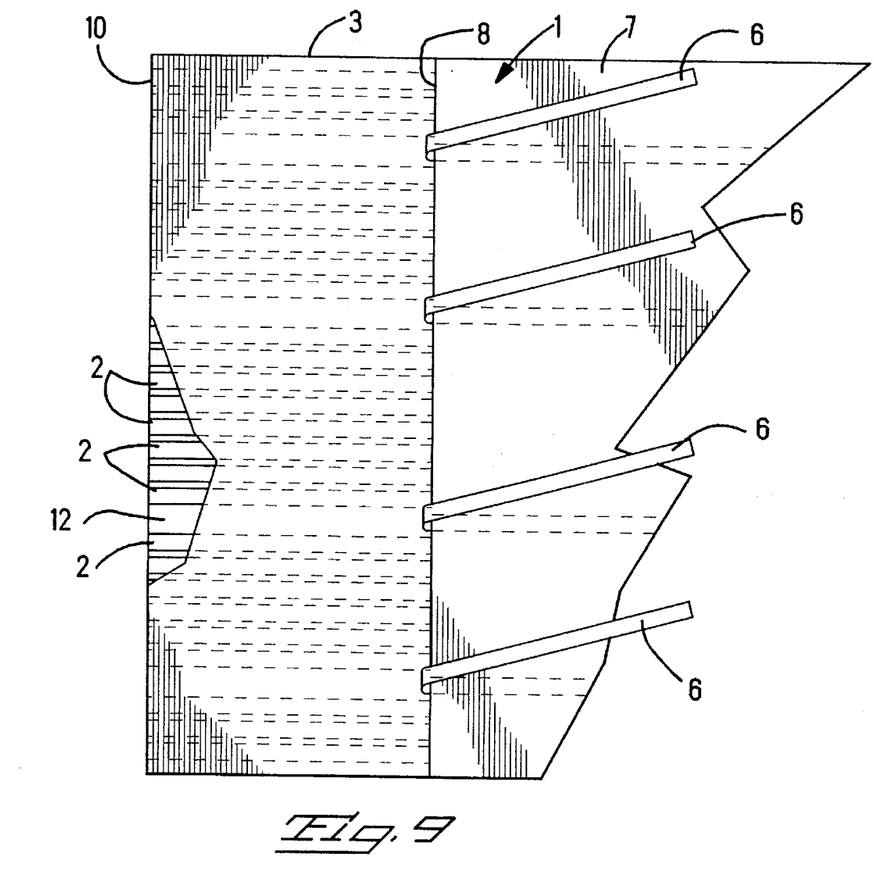
FIG. 9 is a top view of a portion of a cable with parts cut away.

With reference to FIG. 7, the cable 1 is severed to provide cut ends 10 on the cable. The insulation 3 and the conductors 2 are severed at the cut ends 10. With reference to FIG. 9, each said ground conductor 6 can be bent away from the opening 8, revealing the insulation 3 having therein the signal conductors 2.

As shown in FIGS. 1 and 2, each said ground conductor 6 can be bent to extend into the plane of the signal conductors 2. Thereby, the signal conductors 2 and the ground conductors 6 can extend on pitch spacings in a common plane of the conductors 2. The conductors 2, 6 are bared, and are ready for termination, for example, with electrical terminals as disclosed in U.S. Pat. No. 4,172,626.

Figure 8:
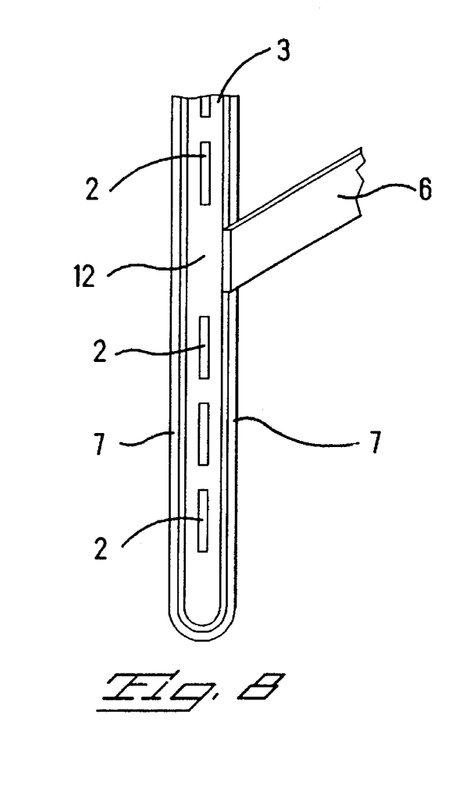
FIG. 8 is an end view of a portion of a cable shown in FIG. 9.
Figure 10:
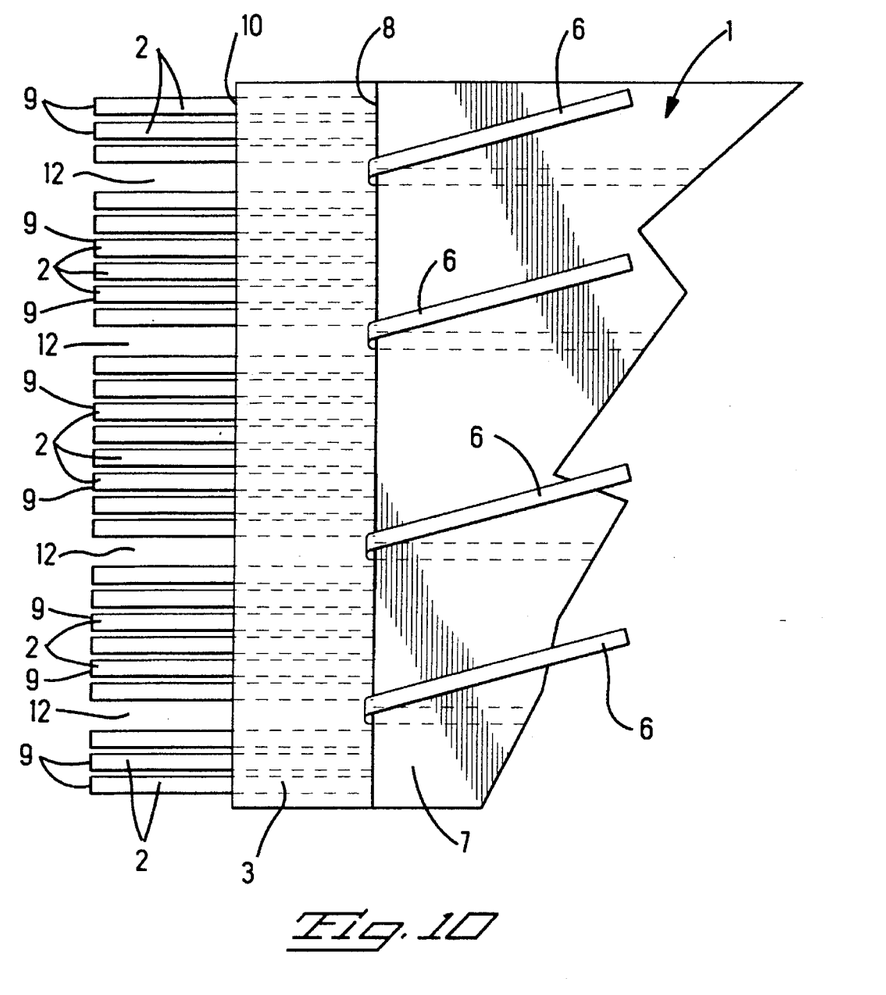
FIG. 10 is a top view of a portion of a cable.

The cable 1 is constructed for electrical termination in a variety of ways. For example, when the cable is constructed as disclosed with reference to FIG. 6, at the opening 8, individual ground conductors 6, and individual signal conductors 2 within the insulation 3, can be attached to respective insulation piercing terminals, for example, terminals as disclosed in U.S. Pat. Nos. 4,082,402 and 4,357,065. Further, for example, with reference to FIGS. 7 and 8, each said ground conductor 6 can be severed at the opening 8, and each severed ground conductor 6 can be attached to a corresponding electrical terminal, for example, as disclosed in U.S. Pat. No. 3,920,301. Further, for example, with reference to FIG. 9, each said ground conductor 6 can be bent away from the opening 8, uncovering the insulation 3 and the signal conductors 2 within the insulation 3. The conductors 2 within the uncovered insulation 3 can be connected with respective insulation piercing terminals, for example, terminals as disclosed in U.S. Pat. Nos. 4,082,402 and U.S. Pat. No. 4,357,065. Further, for example, with reference to FIG. 10, the insulation 3 can be cut away, revealing exposed and bared ends of the signal conductors 2 that can be connected to electrical terminals, for example, as disclosed in U.S. Pat. No. 4,172,626. Further, for example, as shown in FIGS. 1, 2 and 10, the insulation 3 can be cut away, revealing exposed and bared ends 9 of the signal conductors 2. The conductors 2, 6 extend beyond the cut end 10 on the cut away insulation 3. The signal conductors 2 and each said ground conductor 6 project beyond the cut end 10 now solely on the insulation 3. Each said ground conductor 6 can be bent to extend into the plane of the signal conductors 2. Thereby the signal conductors 2 and the ground conductors 6 can extend on pitch spacings in a common plane of the conductors 2. The conductors 2, 6 project beyond a cut end 10, now solely on an end of the insulation 3, and are ready for termination to electrical terminals, not shown.

The cable 1 can be made of continuous length, with a series of openings 8 along the length. The cable 1 can be cut to a length that extends between selected two spaced apart openings 8, where the cable 1 is to be severed, and thereby cut to length. By severing the cable 1 within one opening 8 to divide the cable 1, the opening 8 itself becomes divided into two parts with the two parts accompanying two cut ends 10 on two separate cables 1. The shield 7 is receded from the cut ends 10, allowing the insulation 3, the signal conductors 2 and each of the ground conductors 6 to project beyond the shield 7.

Although the signal conductors 2 are flexible, flat conductors, the signal conductors 2 can be round. The signal conductors 2 can also be insulated conductors, for example, insulated before being constructed into a cable 1. Additionally the signal conductors 2 can be arranged in twisted pairs along corresponding pitch spacings. Although each ground conductor 6 is a flexible, flat conductor, the ground conductor 6 can be round.

Figure 5A:
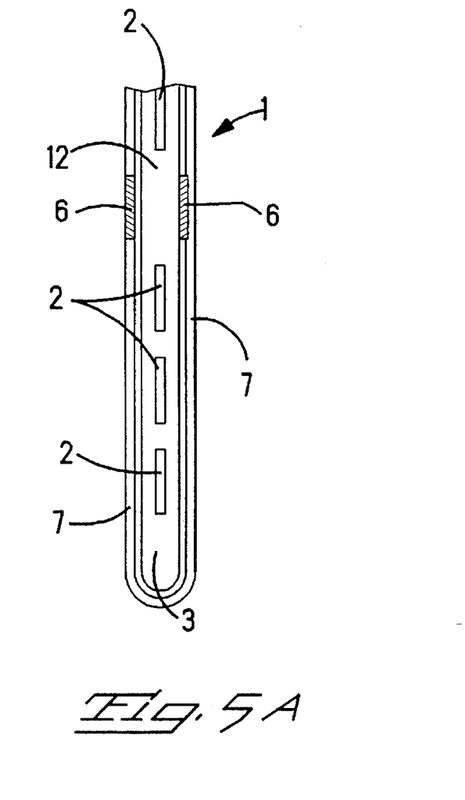
FIG. 5A is a section view of a portion of another embodiment of a cable.
Figure 11:
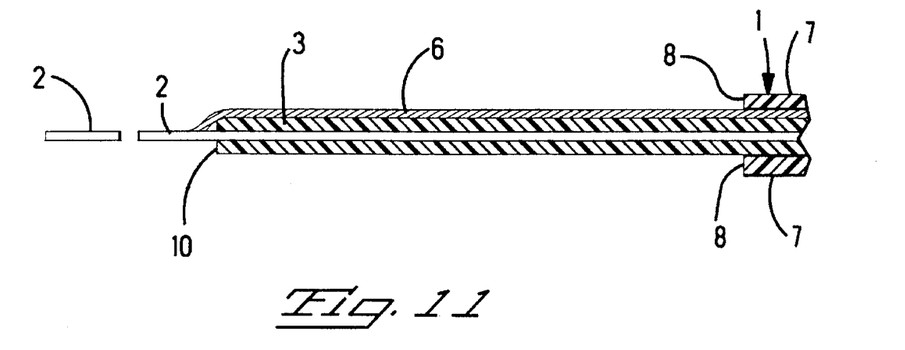
FIG. 11 is a side view of the cable shown in FIG. 2, with parts cut away.
Figure 11A:
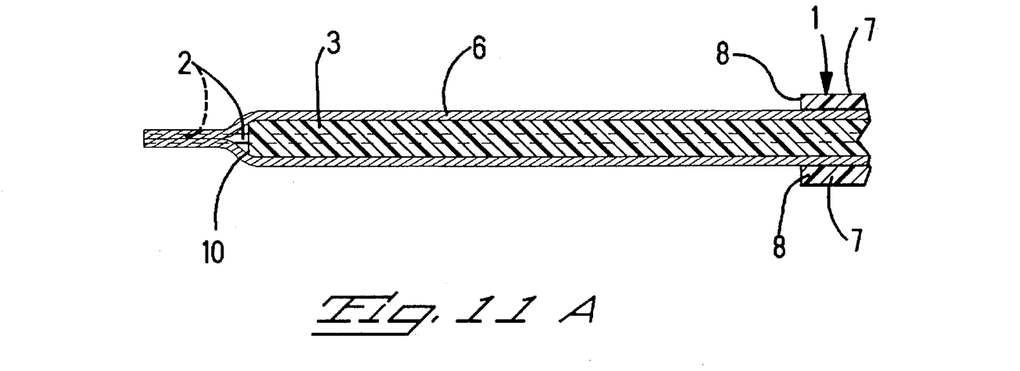
FIG. 11A is a side view of the cable shown in FIG. 5A, with parts cut away.

According to another embodiment of the invention, FIGS. 5A, 8A and 11A, at least two ground conductors 6 extend, respectively, above and below said one of the pitch spacings. One of the ground conductors 6 extends along a top side of the ribbon c,f insulation 3. The other of the ground conductors 6 extends along an opposite side, for example, the underside of the ribbon of insulation 3. The ground conductors 6 are superposed, above and below the same pitch spacing, and on opposite sides of the ribbon of insulation 3. The shield 7 is connected and joined to the ground conductors 6 by the conductive adhesive. The superposed ground conductors can be joined together, for example, by being terminated with an insulation piercing, electrical terminal, for example, a terminal as disclosed in U.S. Pat. Nos. 4,082,402 and 4,357,065. The two ground conductors 6 on opposite sides of the insulation 3 are joined to opposite sides of the shield 7, which improves the electrical performance of the cable 1, as compared to ground conductors 6 being joined solely to one side of the shield 7.

Figure 8A:
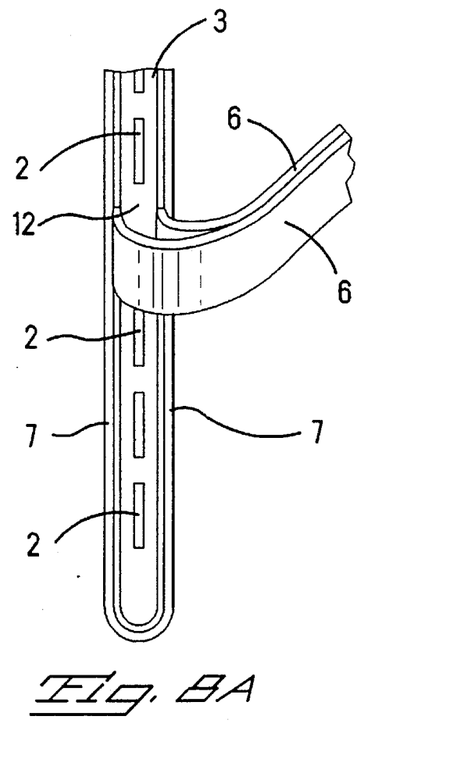
FIG. 8A is an end view of a portion of another embodiment of a cable, as shown in FIG. 5A.

Further, for example, with reference to FIG. 8A, the two superposed ground conductors 6 can be severed at the opening 8. With reference to FIG. 11A, both severed ground conductors 6 can be superposed in engagement with each other. The engaged and superposed ground conductors 6 can be attached together. For example, the superposed ground conductors 6 can be terminated by one in the same corresponding electrical terminal, for example, as disclosed in U.S. Pat. No. 3,920,301. The engaged and superposed ground conductors 6 provide ground conductors 6 that ground, respectively, opposite sides of the shield 7. The opposite sides of the shield 7 can be constructed as two separate pieces that are electrically commoned together when the superposed ground conductors 6 engage each other.

We claim:

1. An electrical cable comprising: a flexible and flat conductive shield, a flexible ribbon of insulation separating the shield from multiple flexible signal conductors extending along the insulation, and at least one flexible ground conductor between the insulation and the shield, each said ground conductor being in a second plane that is separated from a plane of the signal conductors, and at least one opening through the shield exposing the insulation and each said ground conductor.

2. An electrical cable as recited in claim 1 wherein, the signal conductors are spaced apart one from another by corresponding spaces, and each said ground conductor overlies and extends along a corresponding space.

3. An electrical cable as recited in claim 1 wherein, the shield is secured to and bonded to each said ground conductor.

4. An electrical cable as recited in claim 1 wherein, the shield is secured to said insulation.

5. An electrical cable as recited in claim 1 wherein, the shield is secured to said insulation, and is secured to and bonded to each said ground conductor.

6. An electrical cable as recited in claim 1 wherein, the signal conductors are imbedded within the insulation.

7. An electrical cable as recited in claim 1 wherein, each said ground conductor bridges across said at least one opening without being secured to the insulation exposed at said opening.

8. An electrical cable comprising: a flexible and flat conductive shield, a flexible ribbon of insulation separating the shield from multiple flexible signal conductors extending along the insulation, and at least one flexible ground conductor between the insulation and the shields the signal conductors are spaced apart on pitch spacings, with a corresponding one of said signal conductors absent from at least one of the pitch spacings, and each said ground conductor extending above said one of the pitch spacings and at least one opening through the shield exposing the insulation and each said ground conductor.

9. An electrical cable as recited in claim 8 wherein, each said ground conductor bridges across said at least one opening without being secured to the insulation exposed at said opening.

\* \* \* \* \*